United States Patent
Meadows

[19]

[11] Patent Number: 6,091,966
[45] Date of Patent: Jul. 18, 2000

[54] DUAL-BAND, DUAL-MODE POWER AMPLIFIER

[75] Inventor: Ronald C. Meadows, Zebulon, N.C.

[73] Assignee: Ericsson, Inc., Research Triangle Park, N.C.

[21] Appl. No.: 08/939,870

[22] Filed: Sep. 29, 1997

[51] Int. Cl.[7] .................................................. H04Q 7/32
[52] U.S. Cl. ...................... 455/553; 455/80; 330/124 R
[58] Field of Search ................. 330/124 R, 126, 330/129, 207 R, 295–296; 455/74, 78, 80, 83, 93, 127, 124, 341, 552–553; 375/216

[56] References Cited

U.S. PATENT DOCUMENTS

| | | | |
|---|---|---|---|
| 5,060,294 | 10/1991 | Schwent et al. | 455/93 |
| 5,155,724 | 10/1992 | Edwards | 370/297 |
| 5,175,871 | 12/1992 | Kunkel | 455/69 |
| 5,248,979 | 9/1993 | Orme et al. | 342/58 |
| 5,392,463 | 2/1995 | Yamada | 455/93 |
| 5,423,078 | 6/1995 | Epperson et al. | 455/89 |
| 5,438,684 | 8/1995 | Schwent et al. | 455/89 |
| 5,483,209 | 1/1996 | Takayama . | |
| 5,530,923 | 6/1996 | Heinonen et al. | 455/126 |
| 5,541,554 | 7/1996 | Stengel et al. | 455/93 X |
| 5,546,051 | 8/1996 | Koizumi et al. | 330/297 |
| 5,550,895 | 8/1996 | Burson et al. | 455/552 |
| 5,640,686 | 6/1997 | Norimatsu | 455/74 |
| 5,673,287 | 9/1997 | Colvis et al. | 375/216 |
| 5,774,017 | 6/1998 | Adar | 330/126 X |
| 5,884,149 | 3/1999 | Jaakola | 455/127 X |

FOREIGN PATENT DOCUMENTS

| | | | |
|---|---|---|---|
| 2111616 | 6/1994 | Canada | H03F 1/02 |
| 2120679 | 11/1994 | Canada | H03F 3/68 |
| 744831 | 11/1996 | European Pat. Off. | H03H 7/46 |
| 07312523 | 11/1995 | Japan | H03F 1/02 |
| 08125450 | 5/1996 | Japan | H03F 1/02 |

OTHER PUBLICATIONS

PCT International Search Report for International Application No. PCT/US98/18129 dated Dec. 29, 1998.

*Primary Examiner*—William G. Trost
*Attorney, Agent, or Firm*—Coats & Bennett, P.L.L.C.

[57] ABSTRACT

A power amplifier circuit for a radio transceiver has a linear mode amplifier and a saturated (nonlinear) mode amplifier, a diplex matching circuit coupled to the linear mode amplifier for impedance matching and for separating transmitted signals in a plurality of frequency bands, a low pass matching circuit coupled to the output of the saturated mode amplifier and means for selectably placing the power amplifier circuit in a linear mode for or a saturated mode, corresponding to digital and analog modes of operation of the cellular telephone, respectively. In linear or digital mode, the linear amplifier is biased in the on state and the saturated mode amplifier may be biased in the off state. Similarly, in the saturated or analog mode of operation, the saturated mode amplifier is biased in the on state and the linear amplifier may be biased in the off state. The amplifier circuit may include a switch or circuit, coupled to an output of the diplex matching circuit and the output of the low pass matching circuit, for selectably coupling the first diplex matching circuit output or the low pass matching circuit output to an output line when the amplifier circuit is selectably placed in linear mode or saturated mode, respectively.

13 Claims, 4 Drawing Sheets

DUAL-BAND, DUAL-MODE POWER AMPLIFIER

BACKGROUND OF THE INVENTION

1. Field of Invention

The present invention relates generally to power amplifiers and in particular to a dual-band, dual-mode power amplifier.

2. Description of Related Art

In the United States, cellular operating licenses have been awarded by the Federal Communication Commission (FCC) pursuant to a licensing scheme which divides the country into geographic service markets. Cellular licenses were originally granted for radio frequency (RF) blocks in the 800 MHz range. Most 800 MHz cellular telephone systems in the United States utilize the Advanced Mobile Phone Service (AMPS) analog air interface standard. A later generation air interface standard for the 800 MHz band, known as D-AMPS, has subsequently been developed and implemented. The D-AMPS standard comprises both digital and analog cellular communication. Thus, there are presently both analog (AMPS) and digital (D-AMPS) cellular telephone networks in operation at 800 MHz in the United States.

In response to increased demand for cellular services, a number of digital air interface standards were developed for providing efficient digital communication of voice, data, fax and text messages under the umbrella of "personal communications services" or PCS.

The FCC recently auctioned spectrum in the 1900 MHz range for use by PCS systems. Operational PCS systems, such as systems based on the GSM TDMA (Time Division Multiple Access) or IS-95 CDMA (Code Division Multiple Access) air interface standards, are now beginning to appear in the United States. Meanwhile, existing 800 MHz cellular systems are continuing to operate.

Thus, there are presently operating in the United States analog and digital cellular systems at 800 MHz and digital PCS systems at 1900 MHz. Mobile subscribers who desire to receive services from systems operating at 800 MHz and from systems operating at 1900 MHz must either use two different mobile transceivers capable of operating within the cellular or 800 MHz band and the PCS or 1900 MHz band, respectively, or, preferably, use a single "dual-band" mobile transceiver which can receive and transmit RF signals in both frequency bands. Moreover, mobile subscribers who wish to communicate using both analog and digital systems must again either use two different mobile transceivers or, preferably, use a single "dual-mode" transceiver. Ideally, a mobile transceiver is capable of both dual-mode and dual-band operation to provide the user with maximum flexibility and functionality.

A problem arises, however, in that the power amplifier used in a mobile transceiver is typically optimized for use in a particular band (i.e. PCS or AMPS) and in a particular mode (i.e. analog or digital). This problem is manifested in two ways: as an impedance matching problem and as an amplifier biasing problem.

For maximum efficiency, the impedance at the output of the amplifier must be matched to the impedance of a duplexer/diplexer prior to transmission. However, the impedance of the matching circuit is dependent on the frequency of operation. Thus, a conventional matching circuit optimized for matching the impedance of an amplifier at 800 MHz will generally not optimally match the impedance of the same amplifier operating at 1900 MHz. Moreover, the impedance of the amplifier is dependent on the mode of operation. Thus, a conventional matching circuit optimized for matching the impedance of an amplifier operating at 800 MHz in the AMPS mode will not adequately match the impedance of the same amplifier operating at 800 MHz in the D-AMPS digital mode.

The biasing problem arises due to the fact that the efficiency of an amplifier is dependent on the mode or class of operation of the amplifier which is determined by the modulation technique employed. Typically, analog communication systems employ well known frequency modulation (FM) techniques to modulate analog information onto a carrier signal, while digital communication systems employ digital modulation schemes, such as $\pi/4$ DQPSK (Differential Quadrature Phase Shift Keying) modulation. Signals transmitted using frequency modulation are most efficiently amplified by a power amplifier biased and operating in non-linear or saturated mode. Signals transmitted using $\pi/4$ DQPSK modulation, on the other hand, are most efficiently amplified by a power amplifier biased and operating in linear mode.

One possible solution to the impedance matching problem is to provide the amplifier with separate, switched high-pass and low-pass matching networks at its output. However, the switch must be capable of handling high power, which tends to require a large, costly switch. Moreover, the match at 800 MHz will necessarily be a blended match, causing a loss of efficiency in the analog mode.

Another solution to the impedance matching problem is to provide a broadband power matching circuit covering both desired frequency bands and having peaks at the transmit bands. Such a configuration would tend to waste bandwidth, however, when the desired match frequencies differ by an octave or more and the desired bandwidth in each band is relatively narrow. The well known Fano's Limit shows that there is a physical limitation on broadband matching when a reactive element (such as the drain-source capacitance of a transistor) is present.

In transceivers having a single amplifier chain, prior art solutions to the impedance matching problem address the biasing problem by providing separate bias levels, although the impedance match remains constant. If a single amplifier is used to amplify both analog and digital signals, the amplifier must be biased to barely meet linearity requirements while retaining as much analog efficiency as possible. Such an arrangement tends to be inefficient. As radiotelephones become smaller and power consumption requirements become stricter, such inefficient operation is highly undesirable.

Therefore, there is a need in the art for a power amplifier circuit capable of efficient operation in both 800 MHz and 1900 MHz systems and in both analog and digital systems. Such a dual-band, dual mode power amplifier preferably provides an integrated, efficient solution to the problems described above.

SUMMARY OF THE INVENTION

It is therefore an object of the present invention to provide a power amplifier circuit for a radio transceiver capable of efficiently amplifying RF signals in a linear or saturated mode of operation.

It is a further object of the present invention to provide a power amplifier circuit for efficiently amplifying RF signals in a plurality of frequency bands or ranges.

It is a further object of the present invention to provide a dual-band, dual-mode power amplifier circuit that may be selectably placed in a linear mode of operation for amplifying DQPSK modulated signals and a saturated mode of operation for amplifying frequency modulated signals.

The foregoing and other objects are accomplished in a power amplifier circuit having a linear mode amplifier for amplifying digitally modulated signals and a saturated (nonlinear) mode amplifier for amplifying frequency modulated (analog) signals. A diplex matching circuit is coupled to the linear mode amplifier for impedance matching and for separating D-AMPS (800 MHz band) and PCS (1900 MHz band) digital signals. A power impedance matching circuit is coupled to the output of the saturated mode amplifier.

The amplifier circuit includes means for selectably placing the amplifier circuit in a linear mode or a saturated mode, corresponding to digital and analog modes of operation of the radiotelephone, respectively. In the linear or digital mode, the linear amplifier is biased in the on state and the saturated mode amplifier may be biased in the off state. Similarly, in the saturated or analog mode of operation, the saturated mode amplifier is biased in the on state and the linear amplifier may be biased in the off state.

The amplifier circuit may include means for selectably coupling either the first diplex matching circuit output or the low pass matching circuit output to an output line when the amplifier circuit is selectably placed in linear mode or saturated mode, respectively.

These and other objects of the invention, together with features and advantages thereof will become apparent from the following detailed specification when read with the accompanying drawings in which like reference numerals refer to like elements.

DETAILED DESCRIPTION OF THE PREFERRED EMBODIMENTS

The present invention will now be described with reference to the accompanying drawings, in which preferred embodiments of the invention are shown. However, this invention may be embodied in many different forms and should not be construed as limited to the specific embodiments shown. Rather, the preferred embodiments are provided so that this disclosure is thorough and complete, and will fully convey the scope of the invention to those skilled in the art.

Figure 1:
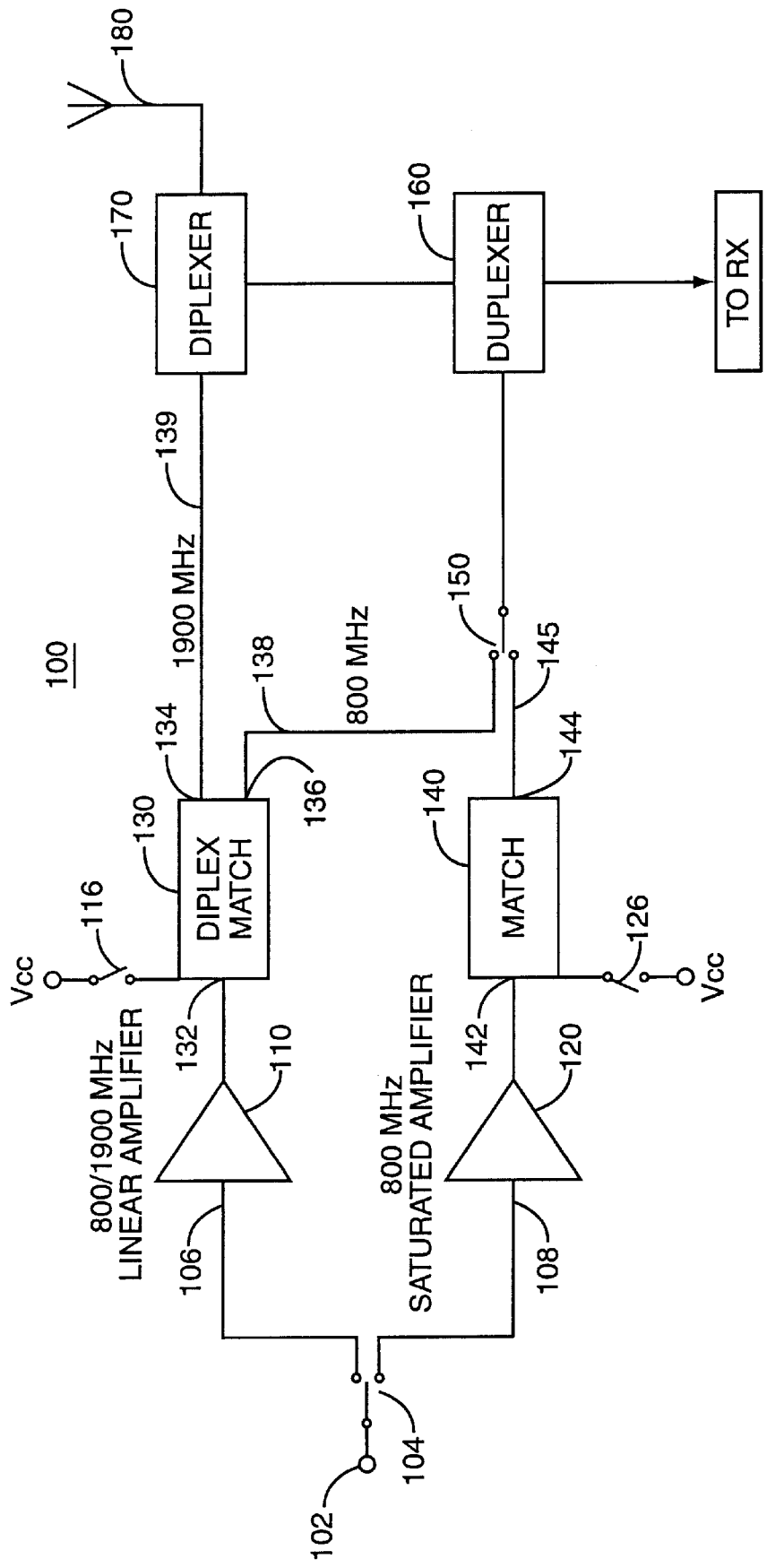
FIG. 1 is a schematic diagram of an embodiment of the present invention.

Referring now to FIG. 1, a dual-mode, dual-band amplifier circuit according to an embodiment of the present invention is indicated generally by reference numeral 100. Amplifier circuit 100 is advantageously included in the transmitter or transceiver of a radiotelephone (not shown) for amplifying both analog and digital signals in two different frequency bands or ranges, thereby providing the radiotelephone with dual-band, dual-mode functionality. Amplifier circuit 100 includes an RF input port 102 which is coupled to a mode select switch 104. Depending on whether the radiotelephone is being operated in a digital or analog mode, the setting of mode select switch 104 will cause input RF signals to be transmitted down digital path 106 or analog path 108, respectively. The position of mode select switch 104 is controlled by a mode control signal from a microprocessor (not shown) within the radiotelephone. The control signal provided by the microprocessor is used to selectively place amplifier circuit 100 in a linear mode or a saturated (nonlinear) mode of operation.

Digital path 106 includes a linear amplifier 110, which efficiently amplifies signals which have been modulated using DQPSK modulation techniques. The output of linear amplifier 110 is coupled to a diplex matching circuit 130 which efficiently separates 1900 MHz signals from 800 MHz signals while providing an impedance match for linear amplifier 110 in both frequency ranges. The structure and function of diplex matching circuit 130 is described in greater detail below.

Diplex matching circuit 130 has a 1900 MHz output 134 and an 800 MHz output 136. The 1900 MHz output is coupled via path 139 to a diplexer 170, which couples the 1900 MHz output signal to an antenna 180.

Analog path 108 includes a nonlinear amplifier 120 which efficiently amplifies frequency modulated signals. The output of nonlinear amplifier 120 is coupled to a matching circuit 140 which provides a 50-Ohm impedance match for nonlinear amplifier 120. Matching circuit 140 also helps suppress harmonic content that could feed back down the 1900 MHz path 139. Matching circuits for use in RF power amplifiers are well known in the art.

Since separate linear and nonlinear amplifiers 110, 120, respectively are provided, the nonlinear amplifier may be operated as a deeply saturated Class C amplifier or as a switched mode class E amplifier. Previous solutions in which a single amplifier was used for both linear and nonlinear amplification required that the amplifier be biased (in Class AB) to barely meet linearity requirements while retaining as much nonlinear efficiency as possible. The result was a blended match that was not optimal for either linear or nonlinear amplification. The present invention overcomes this limitation while providing an amplifier circuit that can effectively and efficiently amplify signals in different frequency bands.

The output of matching circuit 140 on line 145 and the 800 MHz output of diplex matching circuit 130 on line 138 are provided to a high power switch 150. High power switch 150 couples either the 800 MHz output of diplex match circuit 130 (corresponding to a digital 800 MHz signal) or the output of matching circuit 140 (corresponding to an analog 800 MHz signal) to duplexer 160 via output line 161, depending on whether the cellular telephone is being operated digital or analog mode, respectively. As with mode select switch 104, high power switch 150 is controlled by the mode control signal from the radiotelephone's microprocessor. Additionally, high power switch 150 provides isolation for linear amplifier 110, thus preventing linear amplifier 110 from being loaded by nonlinear amplifier 120 and matching circuit 140.

In this application, the terms "duplexer" and "diplexer" both refer to a three port, frequency selective splitter. A duplexer is used to enable an RF transceiver to simultaneously transmit and receive on nearly adjacent frequencies using a common antenna, whereas a diplexer separates input signals into high band or low band signals.

DC biasing for linear amplifier 110 and nonlinear amplifier 120 is provided by switching Vcc inputs 116, 126 on or off depending on the desired mode of operation of the cellular telephone (i.e. digital or analog).

Duplexer 160 is a conventional duplexer designed to permit full duplex operation at 800 MHz. Duplexer 160 couples 800 MHz signals to diplexer 170, which in turn couples the signals to antenna 180 for transmission.

Figure 2:
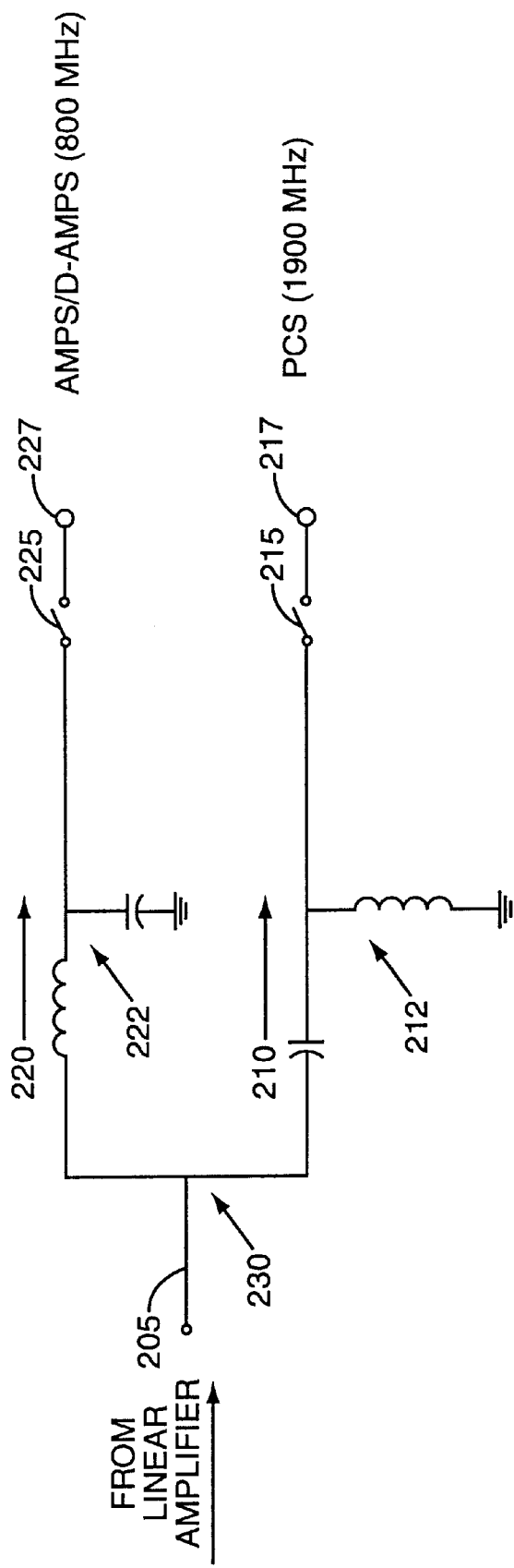
FIG. 2 is a schematic diagram of the diplex power matching circuit shown in FIG. 1.

The embodiment illustrated in FIG. 2 is particularly suited for use in a TDMA transceiver, which operates at half duplex at 1900 MHz. However, the circuit can be easily adapted for use in a CDMA transceiver by providing an additional duplexer in path 139 to permit full duplex operation at 1900 MHz.

FIG. 2 illustrates one embodiment of diplex matching circuit 130. The function of diplex matching circuit 130 is to provide a 50-Ohm impedance match for linear amplifier 110 for both 800 MHz signals and 1900 MHz signals, while preventing 800 MHz signals from loading the 1900 MHz path 210, and vice versa. To achieve the desired results, an impedance matching circuit 230 is provided, having an input port 205, an 800 MHz (or AMPS-band) path 220 and a 1900 MHz (or PCS-band) path 210. AMPS-band path 220 includes a low pass LC matching circuit 222 and a mode selection switch 225, which preferably comprises a PIN diode switch. Mode selection switch 225 is closed when the cellular telephone is operating in digital AMPS mode, and open otherwise in response to the mode control signal from the radiotelephone's microprocessor. Thus, when operating in PCS mode, 1900 MHz signals will be substantially attenuated down AMPS-band path 220, and the AMPS-band matching circuit 222 will not load the PCS-band path 210.

PCS-band path 210 includes a high-pass LC matching circuit 212 and a second mode selection switch 215. Mode selection switch 215 is closed when the cellular telephone is operating in digital PCS mode, and open otherwise in response to the mode control signal. Thus, when operating in AMPS mode, 800 MHz signals will not be transmitted down PCS-band path 210, and the PCS-band matching circuit 212 will not load the AMPS-band path 220.

Figure 3:
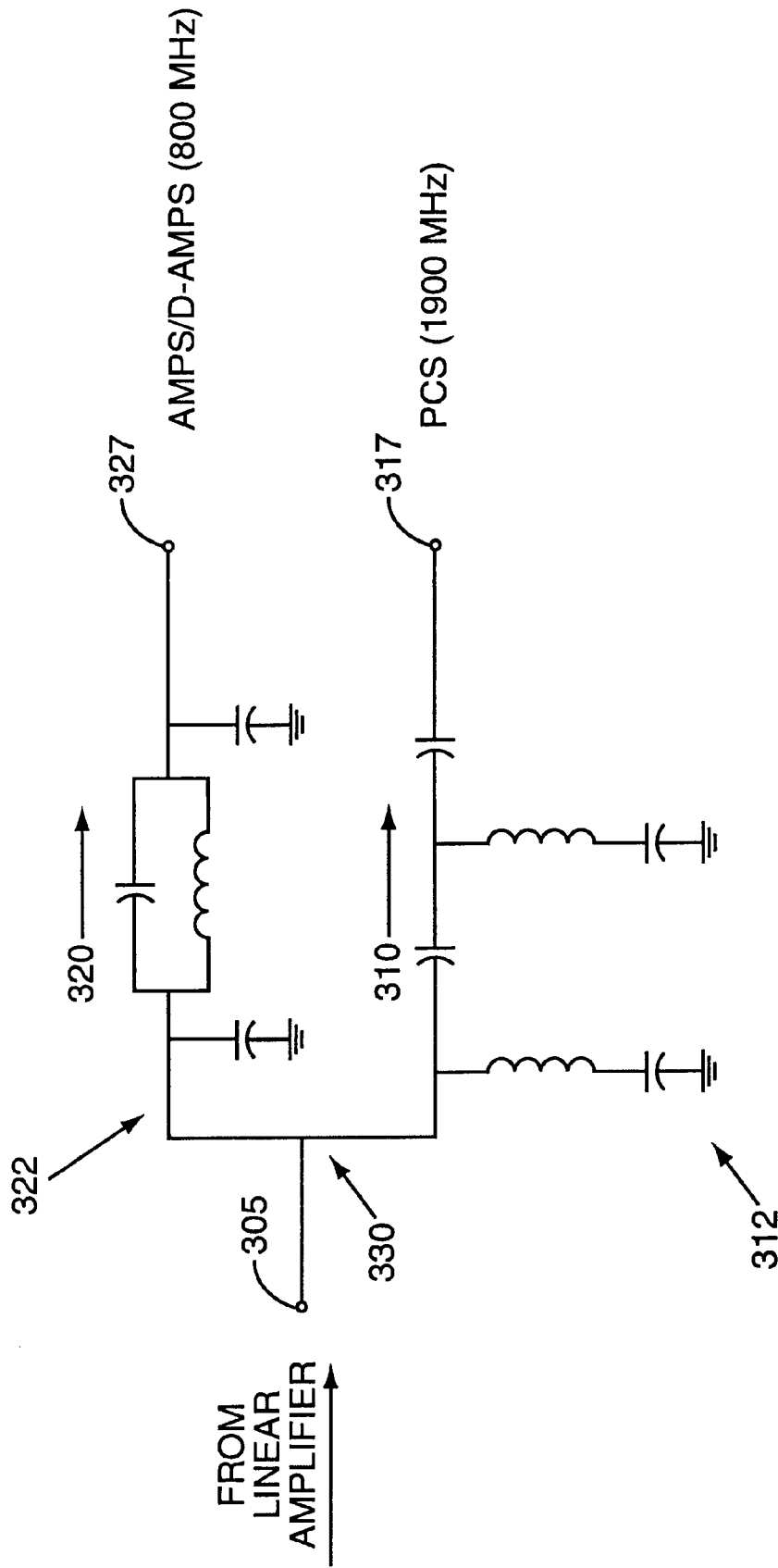
FIG. 3 is a schematic diagram of another embodiment of the diplex power matching circuit shown in FIG. 1.

A second embodiment of diplex matching circuit 130 is shown in FIG. 3 as diplex matching circuit 330. Diplex matching circuit 330 achieves the same result as the diplex matching circuit shown in FIG. 2 without the need to provide mode selection switches 215, 225. Diplex matching circuit 330 includes an RF input port 305, AMPS-band path 320 and PCS-band path 310. AMPS-band path 320 includes a filter/matching circuit 322 which provides a 50-Ohm impedance match to linear amplifier 130 (FIG. 1) at AMPS-band frequencies while presenting a bandstop null at PCS-band frequencies. Similarly, PCS-band path 310 includes a filter/matching circuit 312 which provides a 50-Ohm impedance match to linear amplifier 130 (FIG. 1) at PCS-band frequencies while presenting a bandstop null at AMPS-band frequencies.

The structure and operation of diplex matching circuit 330, including alternative embodiments and additional features thereof, are described in detail in a co-pending U.S. patent application, Ser. No. 08/888,168 filed Jul. 3, 1997, entitled "Impedance Matching Circuit for Power Amplifier," Ronald Boesch and Kevin Conroy, inventors, which is assigned to the assignee of the present invention, and which is incorporated herein by reference in its entirety.

Figure 4:
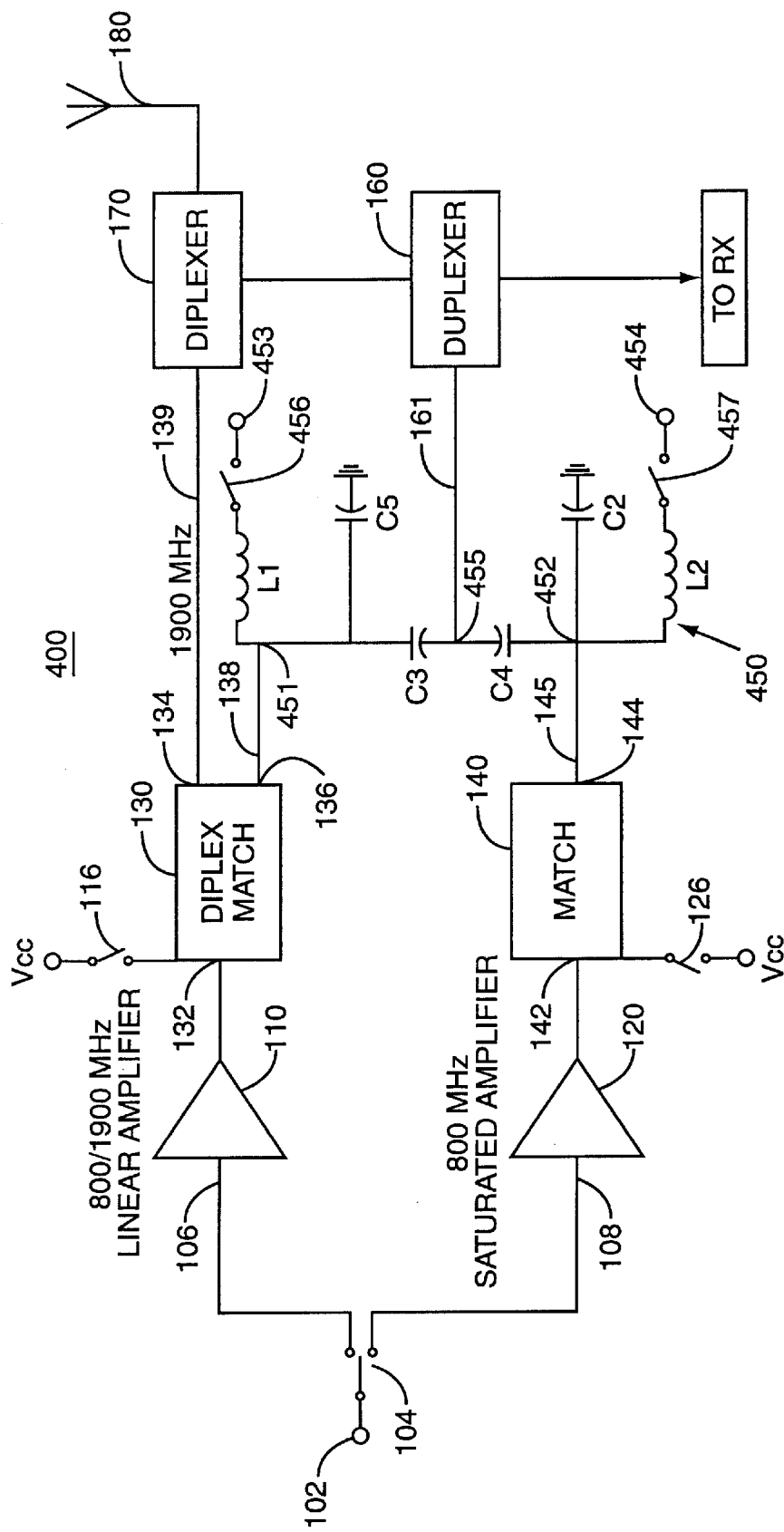
FIG. 4 is a schematic diagram of another embodiment of the present invention.

A second embodiment of an amplifier circuit of the present invention is illustrated in FIG. 4 as amplifier circuit 400. As with amplifier circuit 100, amplifier circuit 400 includes an RF input port 102, a mode selection switch 104, a digital path 106 containing a linear amplifier 110 and a diplex matching circuit 130, and an analog path 108 including a nonlinear amplifier 120 and a low pass matching circuit 140. The 1900 MHz (PCS-band) output of diplex matching circuit 130 is coupled to a diplexer 170 which couples RF signals to antenna 180 for transmission.

In amplifier circuit 400, 800 MHz-band signals output from low pass matching circuit 140 and the 800 MHz output of diplex matching circuit 130 are provided to a coupling network 450. Coupling network 450 includes a first node 451 and a second node 452. The 800 MHz output of diplex matching circuit 130 is coupled via line 138 to first node 451. The output of low pass matching circuit 140 is coupled via line 145 to second node 452. Capacitor C1 is connected between first node 451 and ground, while capacitor C2 is connected between second node 452 and ground. Inductor L1 is coupled between first node 451 and linear Vcc supply 453 via a mode selection switch 456. Inductor L2 is coupled between second node 452 and nonlinear Vcc supply 454 via a mode selection switch 457. When mode selection switch 457 is closed, inductor L2 and capacitor C2 form a parallel resonant circuit which acts as an RF ground to harmonics only.

Coupling network 450 includes a third node 455 which is coupled to first node 451 via DC blocking capacitor C3 and to second node 452 via DC blocking capacitor C4. Third node 455 is coupled via output line 161 to the input of duplexer 160, which is described above in connection with the embodiment illustrated in FIG. 1.

Coupling network 455 operates as follows. When the cellular telephone is operated in digital mode, linear amplifier 110 is biased in the on state as described above. Switch 456 is closed and switch 457 is opened, switching inductor L2 out of coupling network 455. Shunt capacitor C2 then transforms the output impedance at second node 452 to an almost open circuit, thereby reducing the loading on linear amplifier 110. This is particularly true when linear amplifier 110 includes a GaAs HBT (Gallium Arsenide Heterojunction Bipolar Transistor). Inductor L1 and capacitor C1 form a parallel resonant circuit which short circuits harmonic energy generated by linear amplifier 110, and increases the efficiency of the amplifier.

When the cellular telephone is operated in analog mode, the biasing scheme is reversed. I.e., inductor L1 is switched out of the coupling network 450 and inductor L2 and capacitor C2 form a parallel resonant circuit, with capacitor C1 helping to transform the HBT output impedance to substantially an open circuit at first node 451.

While the present invention has been described with respect to its preferred embodiment, those skilled in the art will recognize that the present invention is not limited to the specific embodiment described and illustrated herein. Different embodiments and adaptations besides those shown herein and described as well as many variations, modifications and equivalent arrangements will now be apparent or will be reasonably suggested by the foregoing specification and drawings, without departing from the substance or scope of the invention. Accordingly, it is intended that the invention be limited only by the spirit and scope of the claims appended hereto.

What is claimed is:

1. A power amplifier circuit for amplifying RF signals, said power amplifier circuit selectively operable in a linear mode or a nonlinear mode, comprising:
   a first amplifier;
   a second amplifier;
   a diplex matching circuit coupled to said first amplifier, said diplex matching circuit having first and second outputs; and switching circuitry, coupled to the first output of said diplex matching circuit and the output of said low pass matching circuit, for selectively coupling said first diplex matching circuit output or said low pass matching circuit output to an output line when said amplifier circuit is selectively placed in said linear mode or said nonlinear mode, respectively.

2. A power amplifier circuit as recited in claim 1, further comprising:
an RF input port; and
a mode selection switch coupled to said RF input port, wherein when said power amplifier circuit is in said linear mode, RF input signals received at said RF input port are coupled to an input of said first amplifier;
wherein when said power amplifier circuit is in said nonlinear mode, RF input signals received at said RF input port are coupled to an input of said second amplifier.

3. A power amplifier circuit as recited in claim 1, further comprising:
a diplexer coupled to said second output of said diplex matching circuit;
a duplexer coupled to said output line and to said diplexer; and
an antenna coupled to said diplexer.

4. A power amplifier circuit as recited in claim 1, wherein said diplex matching circuit comprises:
an input port;
a first signal path for coupling RF signals in a first frequency band to said first output port; and
a second signal path for coupling RF signals in a second frequency band to said second output port;
wherein said first signal path includes means for matching the impedance of said first amplifier in said first frequency band and means for preventing signals in said second frequency band from being transmitted to said first output port.

5. A power amplifier circuit as recited in claim 4, wherein said second signal path includes means for matching the impedance of said first amplifier in said second frequency band and means for preventing signals in said first frequency band from being transmitted to said first output port.

6. A power amplifier as recited in claim 4, wherein said means for preventing comprises a PIN diode.

7. A power amplifier as recited in claim 4, wherein said means for preventing comprises a circuit tuned to present a bandstop null to signals in said second frequency band.

8. A power amplifier as recited in claim 1, wherein said switching circuitry comprises a high power switch.

9. A power amplifier as recited in claim 1, wherein said switching circuitry comprises a coupling network means.

10. A power amplifier as recited in claim 1, wherein said first amplifier is a linear amplifier and said second amplifier is a nonlinear amplifier.

11. A power amplifier circuit for amplifying RF signals, comprising:
a first amplifier;
a second amplifier;
a diplex matching circuit coupled to said first amplifier, said diplex matching circuit having first and second outputs;
a low pass matching circuit coupled to the output of said second amplifier;
means for selectively placing said power amplifier circuit in a digital or analog mode of operation, wherein said first amplifier is biased for operation in linear mode when said amplifier circuit is selectively placed in said digital mode of operation and said second amplifier is biased for operation in nonlinear mode when said amplifier circuit is selectively placed in said analog mode of operation; and
means, coupled to the first output of said diplex matching circuit and the output of said low pass matching circuit, for selectably coupling said first diplex matching circuit output or said low pass matching circuit output to an output line when said amplifier circuit is selectably placed in said digital or analog mode of operation, respectively.

12. A cellular telephone operable in a plurality of modes to receive and transmit RF signals in a plurality of frequency bands, comprising:
a first amplifier;
a second amplifier;
a diplex matching circuit coupled to said first amplifier, said diplex matching circuit having first and second outputs;
a low pass matching circuit coupled to the output of said second amplifier;
means for selectively placing said power amplifier circuit in a digital or analog mode of operation, wherein said first amplifier is biased for operation in linear mode when said amplifier circuit is selectively placed in said digital mode of operation and said second amplifier is biased for operation in nonlinear mode when said amplifier circuit is selectively placed in said analog mode of operation; and
means, coupled to the first output of said diplex matching circuit and the output of said low pass matching circuit, for selectively coupling said first diplex matching circuit output or said low pass matching circuit output to an output line when said amplifier circuit is selectively placed in said digital or analog mode of operation, respectively.

13. A power amplifier circuit for amplifying RF signals, said power amplifier circuit selectively operable in a linear mode or a nonlinear mode, said circuit comprising;
a) a first amplifier;
b) a second amplifier;
c) an RF input port;
d) a first switch selectively connecting said RF input port to one of said first and second amplifiers;
e) an analog matching circuit operatively connected to said first amplifier;
f) a diplex matching circuit coupled to said second amplifier, said matching circuit having a first output for outputting signals in a first frequency band and a second output for outputting signals in a second frequency band;
g) a diplexer connected to said first output of said diplex matching circuit;
h) a duplexer;
i) a second switch selectively connecting said duplexer to one of said second output of said diplex matching circuit and said analog matching circuit; and
j) an antenna operatively connected to said diplexer and said duplexer.

* * * * *

UNITED STATES PATENT AND TRADEMARK OFFICE
CERTIFICATE OF CORRECTION

PATENT NO. : 6,091,966
DATED : July 18, 2000
INVENTOR(S) : Ronald C. Meadows

Page 1 of 1

It is certified that error appears in the above-identified patent and that said Letters Patent is hereby corrected as shown below:

Title page,
References Cited, the following patent should be added:
-- 5,969,582    10/1999    Boesch et al.......................333/129 --.

Column 7,
Line 2, should read -- diplex matching circuit and the output of a low pass --.

Signed and Sealed this

Sixteenth Day of April, 2002

Attest:

JAMES E. ROGAN
*Attesting Officer*    *Director of the United States Patent and Trademark Office*